United States Patent [19]
Nakayama et al.

[11] Patent Number: 5,446,427
[45] Date of Patent: Aug. 29, 1995

[54] BALANCED LOW-PASS FILTER

[75] Inventors: Kazuhiro Nakayama; Ikuo Ochiai; Michiya Nakazawa, all of Tsurugashima, Japan

[73] Assignee: Toko Kabushiki Kaisha Toshiba, Tokyo, Japan

[21] Appl. No.: 242,635

[22] Filed: May 13, 1994

[30] Foreign Application Priority Data

May 14, 1993 [JP] Japan .............................. 5-030562 U

[51] Int. Cl.$^6$ ............................................. H03H 7/00
[52] U.S. Cl. ........................................ 333/181; 333/185
[58] Field of Search ............... 333/167, 177, 181, 185, 333/12, 25

[56] References Cited

U.S. PATENT DOCUMENTS 3,340,458 9/1967 Keller ............................... 333/177 X
3,783,417 1/1974 Osada et al. ......................... 333/185

FOREIGN PATENT DOCUMENTS 0010910 1/1987 Japan ................................ 333/25
0128207 6/1987 Japan ............................... 333/181

Primary Examiner—Seungsook Ham
Attorney, Agent, or Firm—Cushman Darby & Cushman

[57] ABSTRACT

The present invention relates to a balanced low-pass filter characterized in comprising a pair of input terminals and a pair of output terminals, wherein a pair of coils is connected in series in a negatively coupled manner between a first input terminal and a first output terminal and a pair of coils is connected in series in a negatively coupled manner between a second input terminal and a second output terminal, the connection point between each pair of coils and each end of each coil opposite to the connection point being connected across to the corresponding point of the corresponding pair of coils, with capacitors therebetween, and the coils being wound on the same bobbin in such a manner that each pair of negatively coupled coils is formed in adjacent winding portions.

3 Claims, 2 Drawing Sheets

BALANCED LOW-PASS FILTER

DETAILED DESCRIPTION OF THE INVENTION

1. Industrial Applicability

The present invention relates to a balanced low-pass filter that is incorporated into a transfer interface circuit used in a local area network (LAN) that organically links together devices such as workstations and enables the transfer of information between such devices.

2. Prior Art

A LAN that organically links together devices such as computers and workstations to transfer information between these devices requires a transfer interface circuit for connecting the transfer paths and these devices. Such a transfer interface circuit is required to exhibit steep attenuation characteristics with respect to signals of frequencies outside a bandwidth. Such characteristics are required in order to achieve the necessary speed of response. Thus, a balanced low-pass filter of this transfer interface circuit must have a good attenuation characteristic.

A circuit diagram of a prior art balanced low-pass filter is shown in FIG. 4.

This prior art balanced low-pass filter comprises a first input terminal 31, a second input terminal 32, a first output terminal 33, and a second output terminal 34. Coils 35, 36, and 37 are connected in series between the first input terminal 31 and the first output terminal 33. Similarly, coils 38, 39, and 40 are connected in series between the second input terminal 32 end the second output terminal 34. Note that the dot by each of these coils in the figure denotes the same polarity.

A connection point 41 between the coils 35 and 36 is connected to a connection point 42 between the coils 38 and 39, with a capacitor 43 therebetween, and a connection point 44 between the coils 36 and 37 is connected to a connection point 45 between the coils 39 and 40, with a capacitor 46 therebetween.

The opposite and of the coil 35 from the connection point 41 is connected to the opposite end of the coil 38 from the connection point 42, with a capacitor 47 therebetween, and the opposite end of the coil 37 from the connection point 44 is connected to the opposite end of the coil 40 from the connection point 45, with a capacitor 48 therebetween.

However, in order to ensure that this prior art balanced low-pass filter has a good attenuation characteristic, it is provided with large numbers of circuit elements such as coils and capacitors. Further, since each of these circuit elements is arranged separately on the circuit board, the final product is large and it is also expensive.

SUMMARY OF THE INVENTION

The present invention provides a balanced low-pass filter which reduces the number of circuit elements without adversely affecting the transfer characteristics of data sent to and received by the various devices such as computers, and which also provides a compact product that is less expensive.

The balanced low-pass filter of the present invention is includes a pair of input terminals and a pair of output terminals, wherein a pair of coils is connected in series in a negatively coupled manner between a first input terminal and a first output terminal and a pair of coils is connected in series in a negatively coupled manner between a second input terminal and a second output terminal. The connection point between each pair of coils and each end of each coil opposite to the connection point is connected across to the corresponding point of the corresponding pair of coils, with capacitors therebetween. The coils are wound on the same bobbin in such a manner that each pair of negatively coupled coils is formed in adjacent winding portions. The balanced low-pass filter of the present invention is further characterized in that, of the negatively coupled coils formed in the adjacent winding portions, a coil wound in one winding portion is also wound in a neighboring winding portion in part.

The balanced low-pass filter of the present invention is still further characterized in that the filter comprises: a pair of input terminals consisting of a first and a second input terminals, a pair of output terminals consisting of a first and a second output terminals, six flanges each of which has a terminal pin for forming five winding portions therebetween, a first coil wound in a first winding portion among the five winding portions and connected to the first input terminal at one end, a second coil wound in a second winding portion adjacent to the first winding portion and serially connected to the first coil at its one end, the other end of the second coil being connected to the first output terminal, at least one of the first and second coils being wound across both the first and second winding portions so as to make up a negative coupling, a third coil wound in a fourth winding portion and connected to the second input terminal at its one end, a fourth coil wound in a fifth winding portion adjacent to the fourth winding portion and serially connected to the third at its one end, the other end of the fourth coil being connected to the second output terminal, at least one of the third and fourth coils being wound across both the fourth and fifth winding portions so as to make up a negative coupling, a first capacitor being connected across the first and second terminals, a second capacitor being connected across the first and second output terminals, and a third capacitor being connected across connecting points, one of which is for connecting the first and second coils and the other is for connecting the third and fourth coils.

DETAILED DESCRIPTION OF THE PREFERRED EMBODIMENTS

Embodiments of the present invention are described below with reference to FIGS. 1 through 3.

Figure 1:
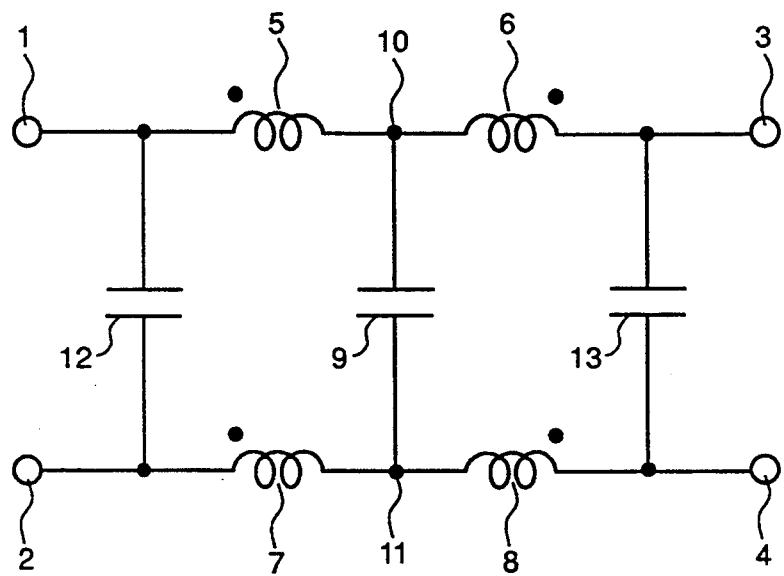
FIG. 1 is a circuit diagram of the balanced low-pass filter of the present invention.
Figure 2:
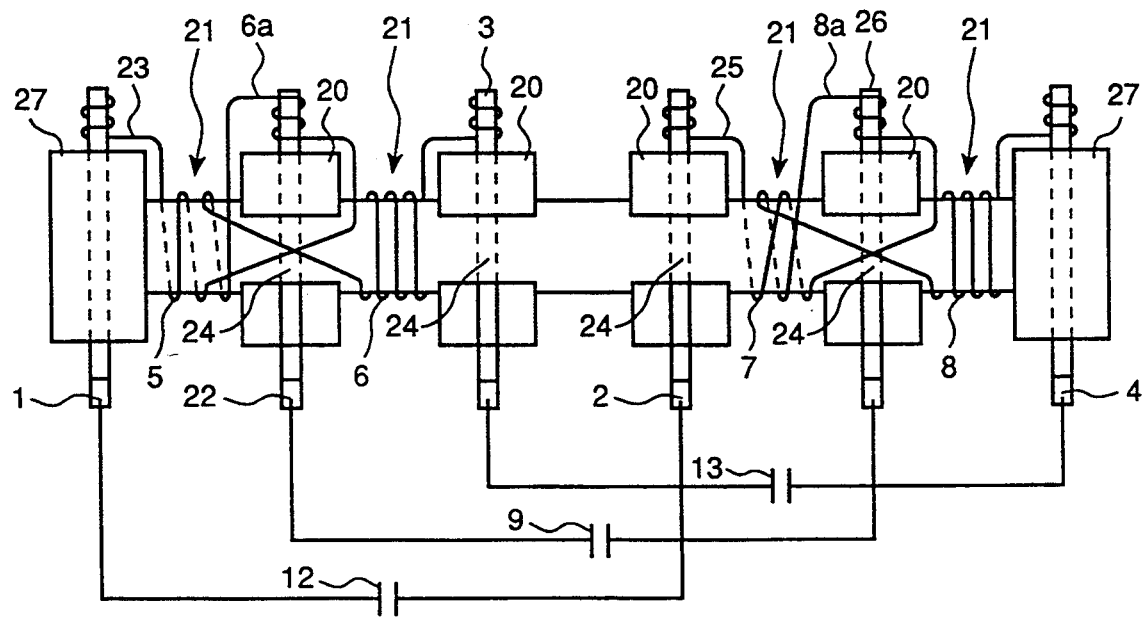
FIG. 2 is a diagram illustrative of an embodiment of the balanced low-pass filter of the present invention.
Figure 3:
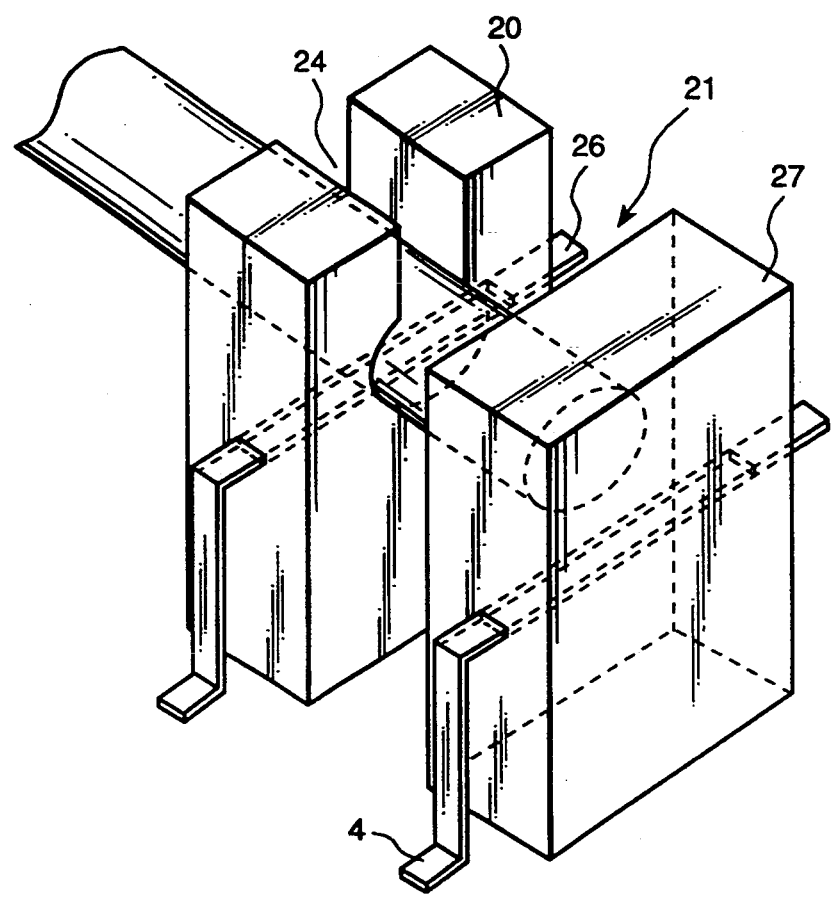
FIG. 3 is a partial perspective view of the embodiment shown in FIG. 2.
Figure 4:
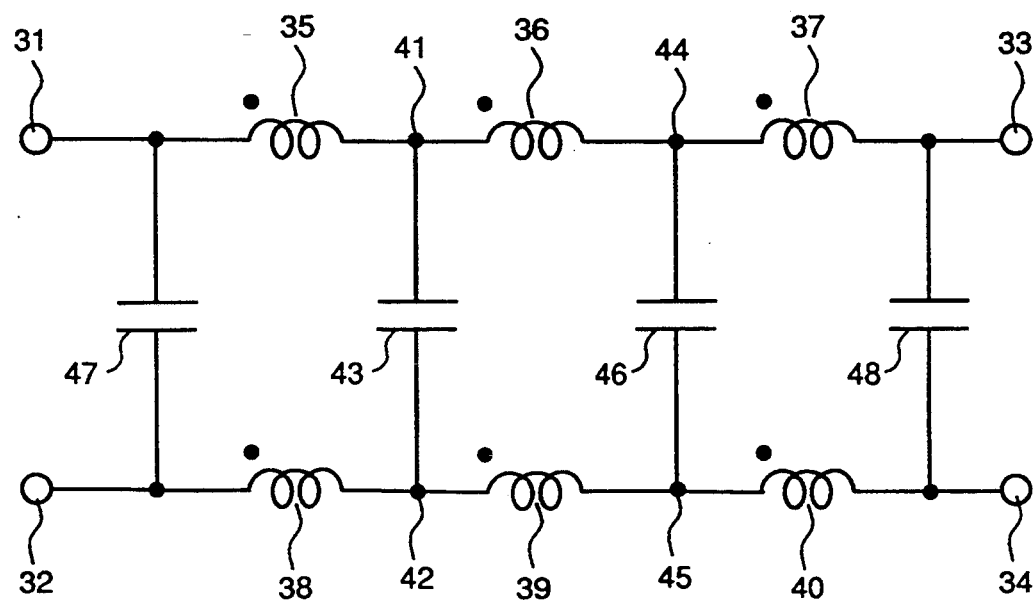
FIG. 4 is a circuit diagram of a prior art balanced low-pass filter.

FIG. 1 is a circuit diagram of the balanced low-pass filter of the present invention, and FIG. 2 is a diagram illustrative of a specific embodiment of this balanced low-pass filter, and FIG. 3 is a partial perspective view of the embodiment of FIG. 2.

In FIG. 1, reference number 1 denotes a first input terminal; 2, a second input terminal; 3, a first output terminal; and 4, a second output terminal.

The coil 5 and another coil 6 are connected in series between the first input terminal 1 and the first output terminal 3, and are mutually negatively coupled. Similarly, a coil 7 and a coil 8 are connected in series between the second input terminal 2 and the second output terminal 4, and are mutually negatively coupled.

A connection point 10 between the coils 5 and 6 is connected to a connection point 11 between the coils 7 and 8, with the capacitor 9 therebetween. The opposite end of the coil 5 from the connection point 10 is connected to the opposite end of the coil 7 from the connection point 11, with a capacitor 12 therebetween, and the opposite end of the coil 6 from the connection point 10 is connected to the opposite end of the coil 8 from the connection point 11, with a capacitor 13 therebetween.

Note that the impedances of the coils 5 and 7 are set to the same value. Similarly, the impedances of the coils 6 and 8 are not to the same value. Note that the dot by each of these coils in the figure denotes the same polarity.

The coils 5 to 8 are each configured of a wire wound around a plastic bobbin, as shown in FIG. 2, and which has the large number of winding portions. Note that FIG. 2 is a plane view.

This bobbin has a plurality of flanges 20 and winding portions 21 separated by these flanges 20, and the upper portion of each of these flanges 20 is provided with a groove 24 to allow a terminal to penetrate through the flanges 20. Element 27 is exposed at opposite side surfaces of the flanges 20 as shown in FIG. 3. These terminals have the same reference numbers as the input and output terminals shown in FIG. 1, and reference numbers 22 and 26 are also used for terminals. A wire 23 is wound within one of the winding portions 21, to form the coil 5. The wire 23 that forms the coil 5 then passes through one of the grooves 24 and is connected to a terminal 22 that corresponds to the connection point 10, where it is wound one turn in the direction opposite to that of the coil 5 in that winding portion 21 as shown by 6a in FIG. 2. The wire 23 then passes again through the grove 24 and the coil 6 is formed by winding the wire 23 in the adjacent winding portion 21 in the direction opposite to that of the coil 5. Thus, the coils 5 and 6 are formed in a negatively coupled manner in neighboring winding portions 21 between the serially connected first input terminal 1 and first output terminal 3.

A wire 25 is then wound within a separate winding portion 21 from the winding portion 21 in which the coil 6 is formed, to form the coil 7. After the wire 25 has been wound by one turn in the direction opposite to that of the coil 7 in the winding portion 21 in which the coil 7 is formed as shown by 8a in FIG. 2, and the remaining portion of the coil 8 is formed by winding the wire 25 in the adjacent winding portion 21, in the direction opposite to that of the coil 7. Thus, the coils 7 and 8 are formed in a negatively coupled manner in adjacent winding portions 21 between the serially connected second input terminal 2 and second output terminal 4. Note that connections are formed on the circuit board between each of the terminal 22 of the capacitor 9 and the connection point 11, the terminals 1 and 2 of the capacitor 12, and the terminals 3 and 4 of the capacitor 13.

Since the coils 5 to 8 are formed in this manner on the same bobbin, a negative mutual inductance ($-M$) is created at each of the connection point 10 between the coils 5 and 6 and the connection point 11 between the coils 7 and 8, so that it is the same as if a coil having a mutual inductance ($+2M$) is connected in series at the capacitor 12. Therefore, series resonance of the capacitor 9 and the coil having the inductance of $+2M$ enables an attenuation pole and thus steepens the attenuation characteristic, so that the number of elements can be reduced without adversely affecting the characteristics.

The balanced low-pass filter of the present invention has been described above by way of a specific embodiment thereof, but it should be understood that the present invention is not limited thereto. For example, two balanced low-pass filters could be formed on the same bobbin, for individual transfer interface circuits for the transmission side and the reception side. In addition, the winding directions of coils formed in adjacent winding portions need not be opposite; the winding direction of the coils that are formed first in the respective winding portions could be in either direction. Further, after the wire has been connected to the terminal corresponding to a connection point, the number of turns on the return to the first winding could be adjusted to ensure negative coupling.

In the balanced low-pass filter in accordance with the present invention as described above, since the two coils connected in series between the first input terminal and the first output terminal are formed on the same bobbin as the two coils connected in series between the second input terminal and the second output terminal, and each of the pair of coils connected in series between the first input terminal and the first output terminal and the pair of coils connected in series between the second input terminal and the second output terminal is negatively coupled, the number of circuit elements is reduced and the product can be made smaller. In addition, the cost can be reduced.

What is claimed is:

1. A balanced low-pass filter comprising:
   a first input terminal and a second input terminal forming a pair of input terminals;
   a first output terminal and a second output terminal forming a pair of output terminals;
   a pair of first coils being connected in series between said first input terminal and said first output terminal, said first coils being negatively coupled and forming a first connecting point therebetween;
   a pair of second coils being connected in series between said second input terminal and said second output terminal, said second coils being negatively coupled and forming a second connecting point therebetween; and
   a plurality of capacitors connecting said first input terminal to said second input terminal, said first output terminal to said second output terminal, and said first connecting point to said second connecting point,
   wherein said first coils and said second coils are wound on a same bobbin in such a manner that each said pair of coils are formed in adjacent winding portions.

2. A balanced low-pass filter according to claim 1, wherein
   each coil in said pair of first coils are wound in an opposite direction, a portion of one of said first coils being wound on the other of said first coils, and
   each coil in said pair of second coils being wound in an opposite direction, a portion of one said second coils being wound on the other of said second coils.

3. A balanced low-pass filter comprising:
a pair of input terminals consisting of a first input terminal and a second input terminal;
a pair of output terminals consisting of a first output terminal and a second output terminal;
six flanges, two of said flanges being provided with said pair of input terminals and two of said flanges being provided with said pair of output terminals;
five winding portions being formed among said six flanges, each said winding portion being formed between two of said flanges;
a first coil being wound in a first winding portion among said five winding portions and having one end connected to said first input terminal;
a second coil wound in a second winding portion adjacent to said first winding portion and having one end serially connected to said first coil and a second end connected to said first output terminal, at least one of said first and second coils being wound across both said first winding portion and said second winding portion to form a negative coupling between said first coil and said second coil;
a third coil being wound in a fourth winding portion and having a first end connected to said second input terminal;
a fourth coil being wound in a fifth winding portion adjacent to said fourth winding portion and having a first end serially connected to said third coil and a second end connected to said second output terminal, at least one of said third and fourth coils being wound across both said fourth winding portion and fifth winding portion to make a negative coupling between said third coil and said fourth coil;
a first capacitor being connected across said first input terminal and said second input terminal;
a second capacitor being connected across said first output terminal and said second output terminal; and
a third capacitor being connected between a first connecting point and a second connecting point, said first connecting point connecting said first and second coils and said second connecting point connecting said third and fourth coils.

* * * * *

UNITED STATES PATENT AND TRADEMARK OFFICE
CERTIFICATE OF CORRECTION

PATENT NO. : 5,446,427

DATED : August 29, 1995

INVENTOR(S) : NAKAYAMA et al

It is certified that error appears in the above-identified patent and that said Letters Patent is hereby corrected as shown below:

On title page, item,

[73] Assignee:  TOKO KABUSHIKI KAISHA,
                Tokyo, Japan

Signed and Sealed this

Eighteenth Day of June, 1996

Attest:

BRUCE LEHMAN

Attesting Officer

Commissioner of Patents and Trademarks